United States Patent [19]
Purdes

[11] Patent Number: 5,114,696
[45] Date of Patent: May 19, 1992

[54] DIAMOND GROWTH METHOD

[75] Inventor: Andrew J. Purdes, Garland, Tex.

[73] Assignee: Texas Instruments Incorporated, Dallas, Tex.

[21] Appl. No.: 563,231

[22] Filed: Aug. 6, 1990

[51] Int. Cl.$^5$ .............................. B01J 3/06
[52] U.S. Cl. .................. 423/446; 156/612; 156/614; 156/DIG. 68
[58] Field of Search ........... 156/612, 614, DIG. 68; 423/446

[56] References Cited

U.S. PATENT DOCUMENTS

| | | | |
|---|---|---|---|
| 3,030,187 | 4/1962 | Eversole | 423/446 |
| 3,030,188 | 4/1962 | Eversole | 423/446 |
| 3,232,799 | 1/1966 | Dash | 156/612 |
| 3,243,323 | 3/1966 | Corrigan et al. | 156/612 |
| 3,520,740 | 7/1970 | Addamiano | 156/612 |

FOREIGN PATENT DOCUMENTS

| | | | |
|---|---|---|---|
| 1151096A | 12/1984 | Japan | 423/446 |
| 2138395A | 12/1985 | Japan | 423/446 |
| 3166798A | 12/1986 | Japan | 156/DIG. 68 |

OTHER PUBLICATIONS

Kobashi, et al.; "CVD Synthesis of (110)-Oriented Bi-layer Diamond Films", May 7-12, 1989; ECS Meeting, Los Angeles, CA. pp. 296-305.

*Primary Examiner*—Robert Kunemund
*Assistant Examiner*—Felisa Garrett
*Attorney, Agent, or Firm*—Ira S. Matsil; James C. Kesterson; Richard L. Donaldson

[57] ABSTRACT

Preferred embodiments grow a first diamondlike film (114) on a silicon substrate (102). Diamond film (116) is then grown on diamondlike film (114), the diamondlike film (114) providing a high density of nucleation sites (108) for the diamond film (116). Diamond film growth is interrupted and a second diamondlike film (134) is grown to provide a second region of nucleation sites (128). Second diamond film (126) is grown from nucleation sites (128), resulting in a relatively thick diamond film (140) with relatively small crystal grains.

14 Claims, 2 Drawing Sheets

DIAMOND GROWTH METHOD

BACKGROUND OF THE INVENTION

1. Field of the Invention.

The present invention relates to grouwth of films of material, and, more particularly, to the growth of diamond-type films and related devices.

2. Description of the Related Art.

Diamond is a useful industrial material, providing hard surfaces for cutting tools, coatings for infrared optics, and thermally conductive electrical insulators for electronic devices. Synthetic diamonds have been produced under high-pressure and high-temperature conditions since 1955; and polycrystalline diamond films can be grown at moderate temperatures and pressures. See D. Vitkavage et al, Plasma Enhanced Chemical Vapor Deposition of Polycrystalline Diamond and Diamond-like Films, 6 J. Vac. Sci. Tech. A 1812 (1988). U.S. Pat. Nos. 3,030,187 and 3,030,188 disclose pyrolysis of hydrocarbon gases to deposit diamond despite the thermodynamic preference for graphite formation by including hydrogen gas which preferentially reacts with graphite and removes it. Similarly, diamondlike films, which are amorphous and contain a large fraction of carbon bonds in the $sp^2$ configuration, can be formed by rf plasma deposition, low-energy ion beam deposition, dc glow discharge deposition, and sputtering. See J. Angus el al, Dense "Diamond-like" Hydrocarbons as Random Covalent Networks, 6 J. Vac. Sci. Tech. A 1778 (1988). However, diamondlike films have inferior hardness for use as cutting tool coatings and have inferior thermal conductivity for use with electronic devices.

Several known methods of growth of diamond films on non-diamond substrates have the problem of formation of nucleation sites. The most common substrate preparation procedure includes abrasion with diamond grit. It is believed that small embedded diamonds act as nucleation sites for the subsequent diamond film growth. But even with diamond-grit-abrasion substrate preparation, grown diamond "films" more closely resemble loose piles of individual diamonds; the nucleation density is apparently too low to readily from a continuous diamond film. This problem is especially severe for those growth conditions that produce the most perfect diamond, as gauged by SEM and Raman spectra.

Co-pending U.S. patent application Ser. No. 231,750 discloses a method for forming a continuous, good quality diamond film. FIGS. 2a–d schematically issustrate the steps of diamond film growth disclosed in the co-pending application. In FIG. 2a, silicon substrate 102 has been abraded with a fine diamond grit, leaving small embedded diamonds in surface 104 of silicon substrate 102, which act as nucleation sites 106. Substrate 102 is then inserted in to a deposition reactor and conditions sufficient for growth of a diamondlike material are introduced in the reactor, resulting in diamondlike layer 114, as shown in FIG. 2b. Diamondlike layer 114 is then subjected to an atomic hydrogen etch, which preferentially etches graphitically-bonded carbon, leaving the surface of the layer with a high density of nucleation sites 108, as shown in FIG. 2c. This is followed by introduction of growth conditions in the reactor sufficient to form diamond material, resulting in the growth of good quality, continuous diamond film 116, as shown in FIG. 2d.

However, analysis has shown that the electrical resistivity of even good quality, continuous diamond thin films is significantly less thah that of bulk diamond material. Although the resistivity of bulk Type I diamonds is in the $10^{12}$ Ohm cm range, the reported resistivity of thin film diamond is typically less than $10^8$ Ohm cm. The low electrical resistivity of diamond films has been attributed to space charge limited current; see Ashok, 50 Appl. Phys. Lett. 763 (1987) and Gildenblat, 53 Appl. Phys. Lett 586 (1988). Others have increased diamond resistivity by lower deposition temperature and attributed low resistivity to band bending at the grain boundaries; see Sokolina, 24 Inor. Mat. 1040 (1989). As diamond films gain increasing use in commercial applications, control of electrical resistivity characteristics will become increasingly necessary.

SUMMARY OF THE INVENTION

The present invention provides an improved multi-step diamond film growth method: the first step growa a film under conditions yielding good film coverage (diamondlike); this diamondlike layer is then etched with atomic hydrogen to preferentially remove graphitic-bonded material, resulting in a primarily diamond-bonded surface; the next step grows a film under conditions yielding a high quality diamond layer; these steps are then repeated to form a second diamondlike layer, and a second diamond layer. In this way the grain size of the diamond layer is controlled and kept small. Small grain size has been found to give improved electrical resistivity properties of the resulting film. Additionally, it is believed that improved resistance to mechanical abrasion and improved resistance to chemical penetration of the film results from the preferred embodiment methods of growing diamond thin films with small grain sizes.

Preferred embodiments include growth of alternating layers of diamondlike and diamond films by various methods, such as hydrocarbon pyrolysis or ion beam deposition. The growth of the diamondlike layers is followed by an atomic hydrogen surface treatment to preferentially remove graphitically-bonded material, providing a high nucleation density surface for the growth of high quality diamond films. By introducing the diamondlike layers during the growth of the diamond layer, new nucleation sites are provided for the subsequent diamond growth, thus controlling the grain size of the crystal structure. Further preferred embodiments omit the atomic hydrogen surface treatment step.

This invention solves the problems of the low electrical resistivity of diamond thin films and the possibility of chemical penetration of the films, by forming a layered diamond film which is of good crystal quality and which has controllable grain size.

BRIEF DESCRIPTION OF THE DRAWINGS

The drawings are schematic for clarity.

No. 231,750, showing the grain structure of the resulting diamond layer;

FIGS. 4a-e are cross sectional elevation views of a preferred embodiment method devices for diamond film growth.

DESCRIPTION OF THE PREFERRED EMBODIMENTS

Figure 2A:
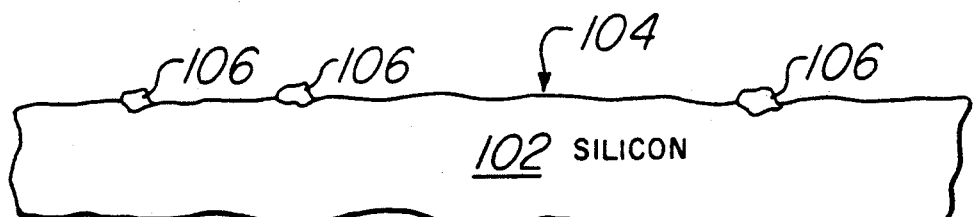
FIGS. 2a–d are cross sectional elevation views of steps of a method of diamond film growth, as disclosed in co-pending U.S. patent application Ser. No. 231,750.
Figure 2B:
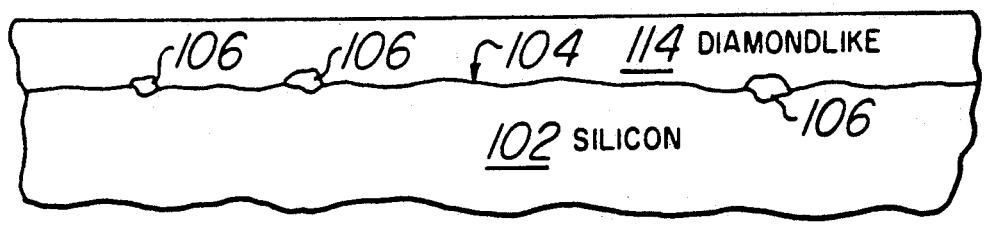
Figure 2C:
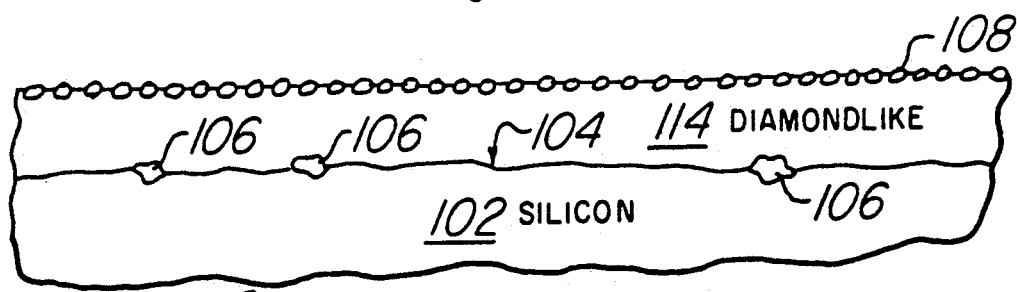
Figure 2D:
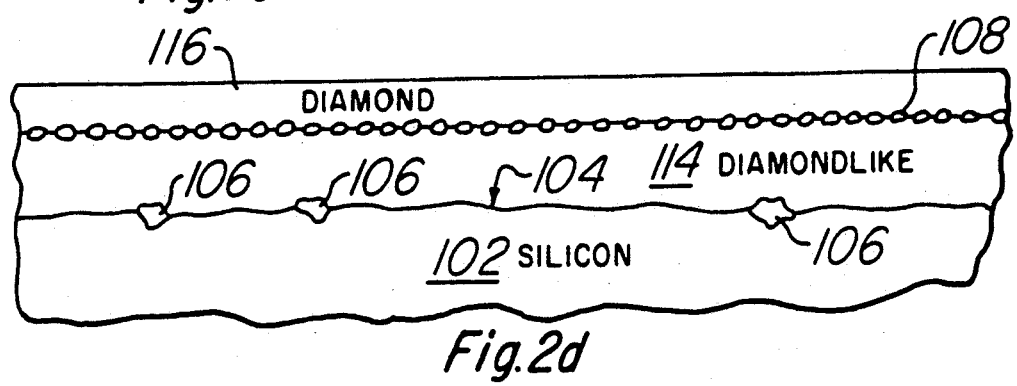
Figure 3:
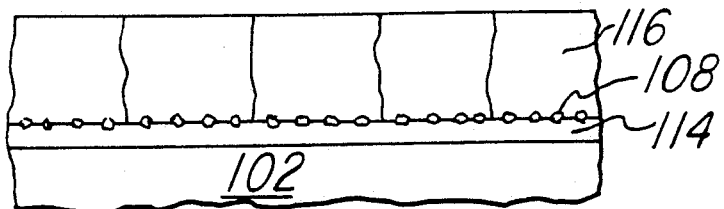
FIG. 3 is a cross sectional elevation view of the diamond film as disclosed in U.S. patent application Ser.
Figure 4A:
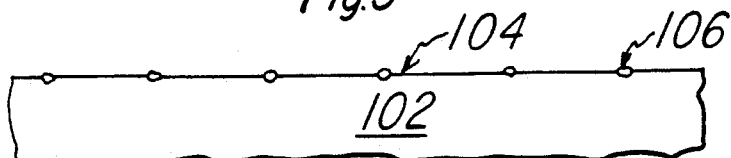
Figure 4B:
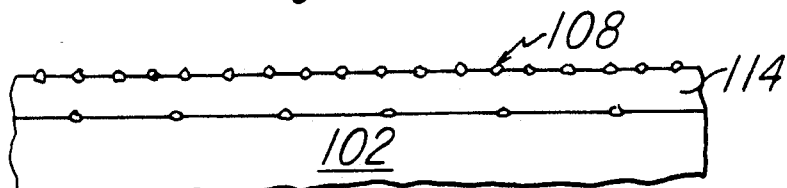

Diamond layer 116 of FIG. 2d actually consists of a plurality of crystal grains, each of which originated from one of the nucleation sites 108, as illustrated schematically in FIG. 3. As the thickness of diamond layer 116 increases the crystal grains increase in size to several microns for a 5 μm thick diamond layer. In a preferred embodiment the crystal grain size of the diamond layer is controlled by introducing a renucleation step about halfway through the diamond growth process, as follows:

(a) Clean silicon substrate 102 with dilute HF or other standard semiconductor industry processes. To enhance the formation rate of the subsequently grown film, surface 104 may be abraded using a diamond grit having a particle size of about 1 micron. After rinsing with distilled water to clean the loose diamond grit from the substrate, surface 104 contains small embedded diamonds 106 which can act as nucleation sites, as shown in FIG. 4a.

Figure 1:
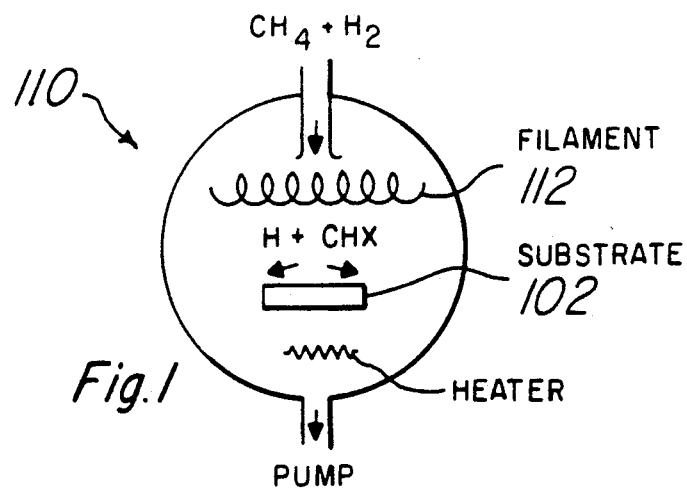
FIG. 1 is a cross sectional elevation view of a reactor for diamond film growth.

(b) Insert the prepared substrate 102 into a hot filament deposition reactor 110 as shown in FIG. 1. Reactor 110 is evacuated and substrate 102 is heated to a temperature of about 1000° C. and filament 112 is heated to about 2000° C. A gaseous flow of about 150 sccm of 2% methane in hydrogen in then introduced into the reactor at a pressure of about 30 Torr. These conditions crack the incoming gases into atomic hydrogen and free radicals such as $CH_3$, resulting in deposition of diamondlike film 114. The growth rate is about 1 micron/hr. Note that the crystallites 106 act as nucleation sites which speed the formation of a continuous diamondlike film.

(c) Change the mixture of the gaseous flow through reactor 110 to pure hydrogen for a duration of about 30 minutes. The graphitic-bonded material in the surface of diamondlike film 114 is preferentially etched away by the atomic hydrogen. The resulting etched surface has a very high density of diamond-bonded sites 108 to nucleate a subsequently overgrown film. A negligible amount of film 114 is removed by the atomic hydrogen etching; see FIG. 4b.

Figure 4C:
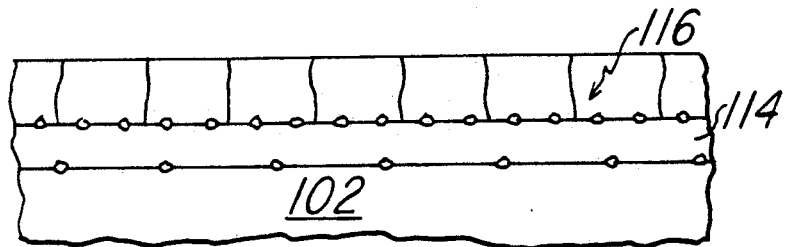
Figure 4D:
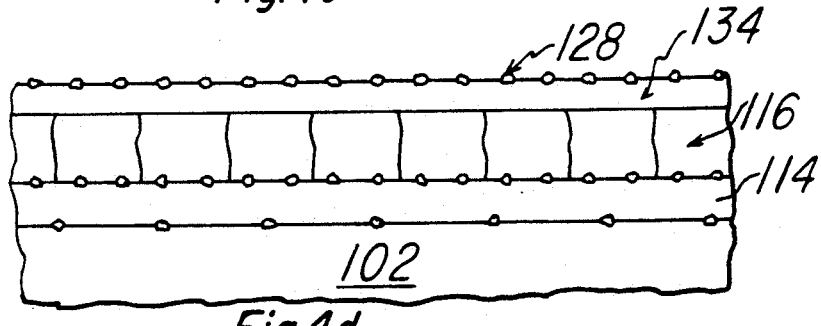
Figure 4E:
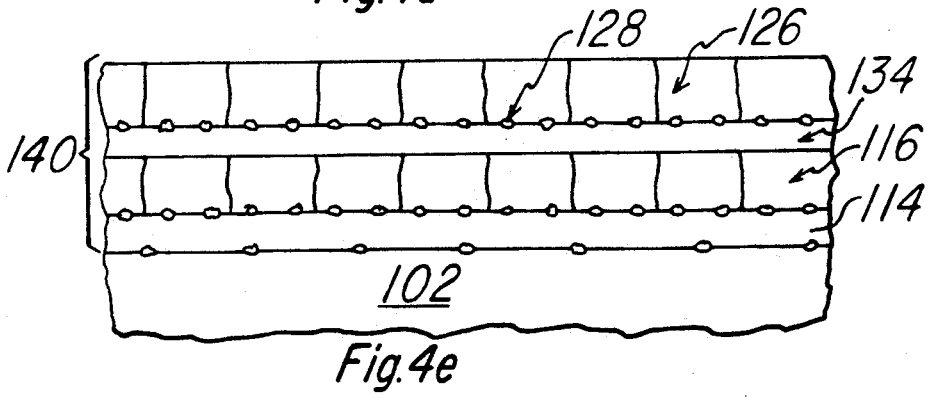

(d) Change the mixture of the gaseous flow through reactor 110 to 1% methane in hydrogen. These conditions are sutiable for the growth of a high quality diamond layer 116. The high density of nucleation sites 108 ensure that this diamond layer 116 will grow uniformly over the surface of the diamondlike layer 114. The film grows from a series of crystal grains, each of which originated at a nucleation site, which grow together to form a film, as shown in FIG. 4c. As the thickness of the film increases the grain size of the crystal structure also increases. The growth rate of the diamond layer is also about 1 micron/hr.

(e) When diamond layer 116 has been grown to about three microns in thickness the nominal crystal grain size is several microns in diameter. At this point, change the mixture of the gaseous flow through reactor 110 back to about 150 sccm of 2% methane in hydrogen at a pressure of about 30 Torr. This forms second diamondlike film 134.

(f) Once again change the mixture of the gaseous flow through reactor 110 to pure hydrogen for a duration of about 30 minutes. The graphiticbonded material in the surface of daimondlike film 134 is preferentially etched away by the atomic hydrogen, resulting in a second etched surface with a very high density of diamond-bonded sites 128 to nucleate a second diamond film. A negligible amount of film 134 is removed by the atomic hydrogen etching; see FIG. 4d.

(g) Once again change the mixture of the gaseous flow through reactor 110 to 1% methane in hydrogen, for high quality diamond growth. Second diamond film 126 shows as a seriers of crystal grains originating from nucleation sites 128, which abut to form a continuous film. Because diamond film 126 has been formed over second diamondlike layer 134, the crystal grains are not in alignment with the grains of diamond layer 116. Resulting composite layer 140, consisting of diamondlike layer 114, diamond layer 116, diamondlike layer 134, and diamond layer 126 has a much smaller typical grain size than would a comparably thick diamond layer grown without the renucleation step.

MODIFICATIONS AND ADVANTAGES

Various modifications of the preferred embodiment method may be made while retaining the features of a series of diamond layers on diamondlike layers. For example, the diamond grit abrasion of step (a) of the first preferred embodiment can be omitted. Similarly, the atomic hydrogen etch of steps (c) and (f) can be omitted. DC discharge or microwave discharge processes may be used in place of the hot filament process described in the first preferred embodiment for either or both of the growth of the diamond layer and the diamondlike layer. Also, other hydrocarbons or carbon-bearing materials, such as ethanol, may be used with the hydrogen in the hot filament process. And various substrate materials may be used. The number of repetitions of the diamondlike and diamond layers can be increased, depending on the desired final film thickness and the desired grain size. The diamondlike layers can be made as thin as desired, so as not to interfere with thermal conductance, while still providing a high density of nucleation sites for subsequent diamond film growth.

The invention provides the advantages of providing good quality diamond film which has a high electrical resistivity due to small grain size of the diamond crystal structure. A further advantage of this invention is decreased porosity and increased resistance to mechanical abrasion of the resulting diamond film.

What is claimed is:

1. A method of diamond film formation on a body comprising the steps of:
   (a) providing a body which will support formation of diamondlike material; and
   (b) forming alternating layers of diamondlike material and diamond material of said body such that at least two diamondlike layers and two diamond layers are formed.

2. The method of claim 1, further comprising the step of:
   (a) subsequent to forming said diamondlike material, but prior to forming said diamond material, etching said diamondlike material with atomic hydrogen.

3. The method of claims 1 or 2, wherein:
   (a) said body is silicon.

4. The method of claims 1 or 2, wherein:

(a) said forming of said diamondlike material is by pyrolysis of carbon-bearing material plus hydrogen.

5. The method of claims 1 or 2, wherein:
(a) said forming of said diamond material is by pyrolysis of carbon-bearing material plus hydrogen.

6. The method of claims 1, wherein:
(a) prior to step (a), abrading a surface of said body with diamond grit.

7. A method of diamond film growth, comprising the steps of:
(a) growing a first diamondlike layer;
(b) growing a first diamond layer on said first diamondlike layer;
(c) growing a second diamondlike layer on said first diamond layer; and
(d) growing a second diamond layer on said second diamondlike layer.

8. The method of claim 7, further comprising the step of:
(a) subsequent to growing said first and second diamondlike layers of steps (a) and (c), but prior to growing said first and second diamond layers of steps (b) and (d), selectively removing graphitic-bonded material from a surface of said first and second diamondlike layers.

9. The method of claim 8, wherein:
(a) said selective removal is by etching with atomic hydrogen.

10. The method of claims 7 or 8, wherein:
(a) said growth of said first and second diamondlike layers is by pyrolysis of carbon-bearing material plus hydrogen; and
(b) said growth of said first and second diamond layers is by pyrolysis of carbon-bearing material plus hydrogen.

11. A method of growing a composite diamond film, comprising the steps of:
(a) forming a first diamondlike layer on a body;
(b) forming a first diamond layer on said first diamondlike layer; said body and said frist diamondlike layer and said first diamond layer forming a layered structure;
(c) forming an additional diamondlike layer on said layered structure;
(d) forming an additional diamond layer on said layered structure; and
(e) repeating steps (c) and (d) at least once.

12. The method of claim 11, wherein:
(a) said forming of said first and said additional diamondlike layers is by pyrolysis of carbon-bearing material plus hydrogen; and
(b) said forming of said first and said additional diamond layers is by pyrolysis of carbon-bearing material plus hydrogen.

13. The method of claim 11, further comprising the step of:
(a) etching said first diamondlike layer and said additional diamondlike layers with atomic hydrogen prior to forming said first and said additional diamond layers.

14. The method of claim 11 wherein step (e) comprises repeating steps (c) and (d) once.

* * * * *